United States Patent
Hsu et al.

(10) Patent No.: US 6,184,157 B1
(45) Date of Patent: Feb. 6, 2001

(54) STRESS-LOADED FILM AND METHOD FOR SAME

(75) Inventors: Sheng Teng Hsu, Camas; Hongning Yang, Vancouver, both of WA (US); David R. Evans, Beaverton, OR (US); Tue Nguyen; Yanjun Ma, both of Vancouver, WA (US)

(73) Assignees: Sharp Laboratories of America, Inc., Camas, WA (US); Sharp Kabushiki Kaisha, Osaka (JP)

(*) Notice: Under 35 U.S.C. 154(b), the term of this patent shall be extended for 0 days.

(21) Appl. No.: 09/088,456

(22) Filed: Jun. 1, 1998

(51) Int. Cl.⁷ .................................................. B05D 3/06
(52) U.S. Cl. ................... 438/784; 438/758; 438/761; 427/249.1; 427/248.1; 427/255.5; 427/275; 118/728
(58) Field of Search .................... 438/758, 761, 438/784; 427/249.1, 248.1, 255.5, 275; 118/728

(56) References Cited

U.S. PATENT DOCUMENTS

| | | | |
|---|---|---|---|
| 4,457,359 | * 7/1984 | Holden | 165/80 C |
| 4,458,746 | * 7/1984 | Holden | 165/80 A |
| 4,508,161 | * 4/1985 | Holden | 165/1 |
| 5,439,524 | * 8/1995 | Cain | 118/723 |
| 5,633,202 | 5/1997 | Brigham et al. | 438/763 |
| 5,695,566 | * 12/1997 | Suzuki | 118/723 E |
| 5,725,718 | * 3/1998 | Banholzer | 156/345 |
| 5,738,729 | * 4/1998 | Dubs | 118/726 |
| 5,804,089 | * 9/1998 | Suzuki | 216/71 |
| 5,900,290 | * 5/1999 | Yang | 427/577 |
| 5,925,226 | * 7/1999 | Hurwitt | 204/298.15 |
| 5,986,857 | * 11/1999 | Hirano | 360/113 |

* cited by examiner

Primary Examiner—Charles Bowers
Assistant Examiner—Lisa Kilday
(74) Attorney, Agent, or Firm—David C. Ripma; Matthew D. Rabdau

(57) ABSTRACT

A method has been provided to counteract the inherent tension in a deposited film. A wafer substrate is fixed to a wafer chuck having a curved surface. When the chuck surface is convex, a tensile stress is implanted in a deposited film. Upon release from the chuck, the deposited film develops a compressive stress. When the chuck surface is concave, a compressive stress is implanted in the deposited film. Upon release from the chuck, the deposited film develops a tensile stress. Loading a film with a compressive stress is helpful in making films having an inherently tensile stress become thermal stable. Stress loading is also used to improve adhesion between films, and to prevent warping of a film during annealing. A product-by-process using the above-described method is also provided.

11 Claims, 7 Drawing Sheets

Fig. 11
TABLE 1

| MATERIAL FOR Si WAFER BACKSIDE COATING | a-F:C FILM THICKNESS CHANGE DURING ANNEALING (400 °C) | INTERNAL STRAIN OF a-F:C FILM AT HIGH TEMPERATURE |
|---|---|---|
| NO COATING | +19.2% | INCREASINGLY EXPANDED |
| $SiO_2$ | +21.6% | INCREASINGLY EXPANDED |
| $Si_3N_4$ | +19.1% | INCREASINGLY EXPANDED |
| Al | −0.7% | INCREASINGLY COMPRESSED |
| Cu | −0.6% | INCREASINGLY COMPRESSED |
| Ni | −2.4% | INCREASINGLY COMPRESSED |
| W | −2.9% | INCREASINGLY COMPRESSED |
| WN | −4.5% | INCREASINGLY COMPRESSED |
| TiN | −3.0% | INCREASINGLY COMPRESSED |

STRESS-LOADED FILM AND METHOD FOR SAME

BACKGROUND AND SUMMARY OF THE INVENTION

This invention relates to integrated circuit (IC) film processes and fabrication, and more particularly, to a system and method of inducing, or modifying stress in a deposited film.

After deposition, a first IC film may be subjected to an annealing processes which heats the IC substrate to temperatures of over four hundred degrees C. Often, these annealing processes are done to cure or process subsequently deposited IC films. High temperature annealing processes may unintentional degrade the earlier deposited first IC film.

Some IC films are deposited with an inherent stress. For example, a film may develop a tensile stress after deposition. Alternately, the deposited film may develop a compressive stress. Many films with an inherent tensile stress have poor thermal stability. That is, these tensile stress films have a change of thickness after heating. The tensile stress film has a greater thickness before annealing than after annealing.

A compressive stress film may have a completely different problem. A compressive stress film is likely to buckle upon heating. Buckling or thinning IC films provided unstable mechanical foundation in IC and can seriously interfere with electrical functions. The mismatches between film layers when either type of stress develops can lead to adhesion problems between layers.

To avoid such problems, many IC processes are tempered to minimize the use of high temperatures. Limiting the temperature range of these IC processes imposes serious fabrication restraints, and also affects the quality, operating speed, and usefulness of the resultant IC.

It would be advantageous if a way could be found to use films that develop an inherent stress without degrading the IC product.

It would be advantageous if the inherent stresses of a deposited film could be modified.

It would be advantageous if a film having inherent stress could be loaded on the IC in such away so as to make it thermally stable, or resistant to buckling when heated.

It would be advantageous if the stress between film layers lo could be reduced to promote better layer adhesion.

Accordingly, a method has been provided for forming a stress-loaded first film over a second film. Alternately stated, the method is used to modify the inherent stress in a film to promote a stress-free interface between film layers. The method comprises the steps of:

a) applying a first stress to the top surface of the second film;

b) deposited a first film over the second film, and so translating the first stress applied in Step a) to the first film;

c) releasing the second film from the stress applied in Step a); and d) in response to releasing the second film from the first stress, loading the first film with a second stress, opposite from the first stress. In this manner, the second film stress is used to load a stress on the first film.

In some aspects of the invention, Step a) includes forming a curve, defined by a first radius, along the second film bottom surface. As a result, a second curve, defined by a second radius, is formed along the first film surfaces. Typically, the bottom surface of the second film is attached to a wafer chuck having a curved mounting surface, whose curve is also defined by the first radius. The stress is provided by securing the second film to wafer chuck.

Step a) includes the first and second radii being in the range between 1 and 1000 meters (m). In one aspect of the invention, the chuck mounting surface is convex so that the first stress on the second film is tensile. Then, Step d) includes the second stress on the first film being compressive. In another aspect of the invention, the chuck mounting surface is concave so that the first stress on the second film is compressive. Then, Step d) includes the second stress on the first film being tensile.

Further steps follow Step d). Step e) anneals the first and second films, and Step f) stops the annealing process after a first time duration. When the first film is loaded with a compressive stress, the first film has a small difference in first thickness, as compared to the originally deposited thickness, after annealing. When the first film is amorphous fluorinated carbon, the difference in thickness is in the range between 0 and 5 percent. The first temperature is in the range between 250 and 450 degrees C. The first time duration is in the range between 15 and 60 minutes.

In some aspects of the invention Step a) includes the first stress on the second film being compressive, and Step d) includes the second stress on the first film being tensile. Then, the first and second films are annealed to form a first film where no buckling has occurred.

A stress-loaded wafer is also provided. The stress-loaded wafer comprises a second film and a first film overlying the second film top surface. The first film has a second stress formed by applying a first, opposite stress to the second film during the deposition of the first film. A second stress loads the first film when the second film is released from the first stress. In this manner, a stress on the second film is used to stress the first film.

As in the above-described method, the first stress is created by forming a first radius curve along the bottom surface of the second film. Likewise, a second radius curve is formed along the first film surfaces. Curves are formed by securing the second film bottom surface to a wafer chuck having a curved mounting surface with a first radius. In this manner, the stresses are provided by securing the second film to the wafer chuck.

The first radius is in the range between 1 and 1000 meters (m). When the first film is amorphous fluorinated carbon, a tensile stress is applied to be second film during the deposition of amorphous fluorinated carbon film. The amorphous fluorinated carbon film is loaded with a compressive stress when the tensile stress is released from the second film. After annealing, the difference in the thickness of the amorphous fluorinated carbon film is less than five percent from the original thickness of the film at deposition.

BRIEF DESCRIPTION OF THE DRAWINGS

FIG. 11 is a table illustrating the thermal stability of an amorphous fluorinated carbon film after annealing with a variety of wafer backside films.

DETAILED DESCRIPTION OF THE PREFER EMBODIMENT

Figure 1:
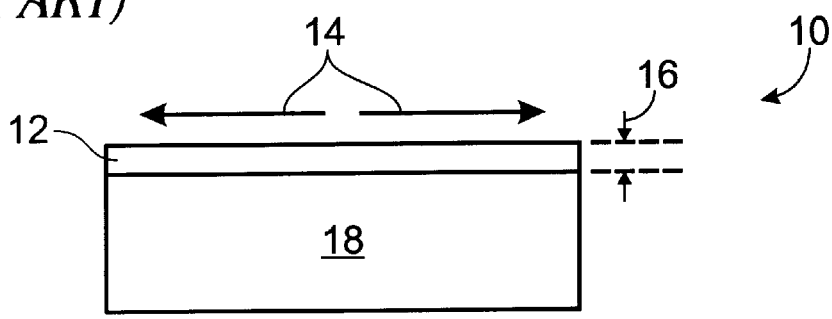
FIG. 1 is a side view of a wafer substrate having a top film with an inherent tensile stress (prior art).

FIG. 1 is a side view of a wafer substrate 10 having a top film 12 with an inherent tensile stress (prior art). The tensile stress is represented with arrows having the reference designator 14. Top film 12 has a thickness 16. In subsequent IC processes, overlying films are typically deposited on top layer 12. The subsequently deposited layers are not shown. It is also typical in the IC processes that IC wafer 10 is subjected to heating processes such as the annealing of semiconductor material.

Figure 2:
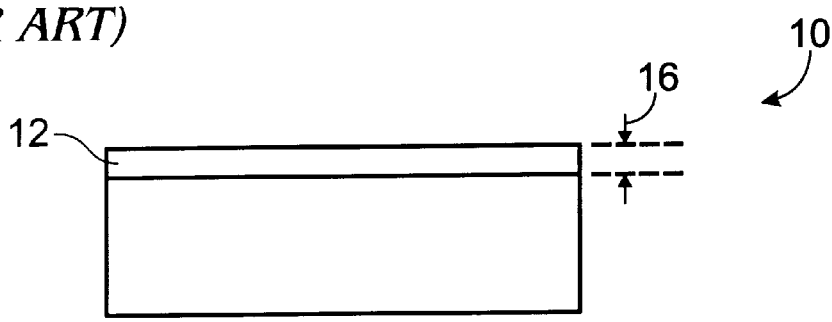
FIG. 2 is a side view of the wafer substrate of FIG. 1 following an annealing procedure (prior art).

FIG. 2 is a side view of wafer substrate 10 of FIG. 1 following an annealing procedure (prior art). Due to the inherent tensile stress of top film 12, thickness 16 has decreased after the annealing procedure. That is, many top film 12 materials are not thermally stable when loaded with a tensile stress and heated.

Figure 3:
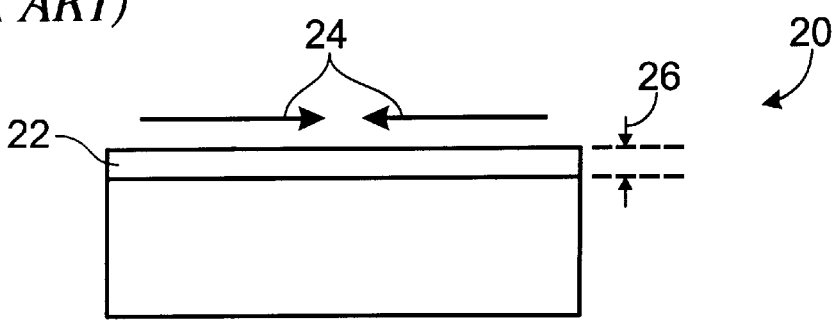
FIG. 3 is a side view of a wafer substrate having a top film with an inherent compressive stress (prior art).

FIG. 3 is a side view of a wafer substrate 20 having a top film 22 with an inherent compressive stress (prior art). The compressive stress is represented with arrows having the reference designator 24. Top film 22 has a thickness 26. As mentioned in the description of FIG. 1, overlying films are typically deposited a top layer 22 in subsequent IC processes. The subsequently deposited layers are not shown. Wafer 20 is often subjected to heating and annealing processes.

Figure 4:
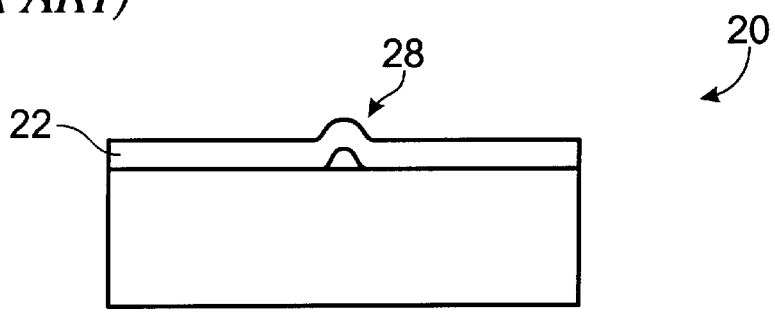
FIG. 4 is a side view of the wafer substrate of FIG. 3 following the an annealing procedure (prior art).

FIG. 4 is a side view of wafer substrate 20 of FIG. 3 following the an annealing procedure (prior art). Due to the inherent compressive stress of top film 22, the danger exists that top film 22 will buckle. The buckling is shown with a arrow labeled with the reference designator 28. For example, tungsten deposited on oxide will often buckle, or separate from the oxide when heated. Likewise, $Si_3N_4$ often buckles when deposited on a metal surface and heated.

Figure 5:
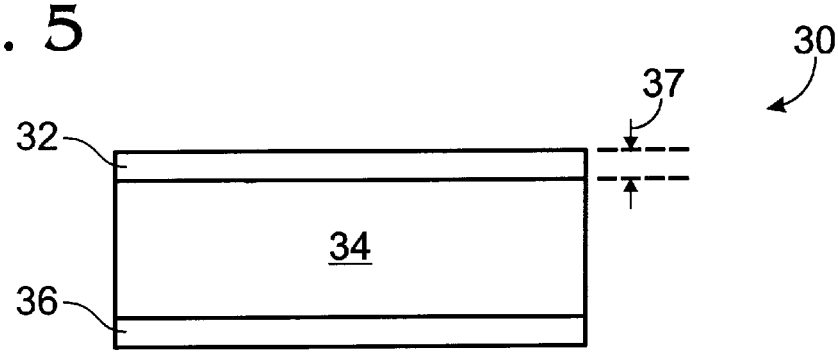
FIG. 5 is a side view of a wafer substrate with a backside film.

FIG. 5 is a side view of a wafer substrate 30 with a backside film. A first film 32 overlies second film 34. Second film 34 overlies a thin backside film 36. Typically, second film 34 is silicon. First film 32 has a first thickness 37. The thermal stability of amorphous fluorinated carbon material as first film 32 was tested with backside film 36. Backside film 36 materials included aluminum, copper, tungsten nitride, titanium nitride, nickel, silicon oxide, and silicon nitride.

Figure 6:
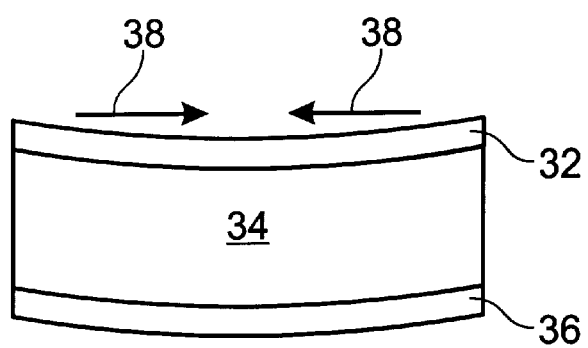
FIG. 6 is a side view of wafer substrate of FIG. 5 during an annealing procedure.

FIG. 6 is a side view of wafer substrate 30 of FIG. 5 during an annealing procedure. A compressive stress, represented with the arrows having the reference designator 38, is placed upon amorphous fluorinated carbon film 32, due to the concave shape of silicon film 34. The concave shape of silicon film 34 is due to the higher thermal expansion coefficient of backside film 36 that is typical of metallic materials, relative to silicon film 34. Upon cooling, it was discovered that the thermal stability of amorphous fluorinated carbon film 32 was improved by compressively stressing film 32 during heating. That is, first thickness 37 of amorphous fluorinated carbon film 32 remains substantially unchanged (see FIG. 5). Further, the lack of a tension mismatch between films 32 and 34 encourages adhesion between the two layers.

Figure 7:
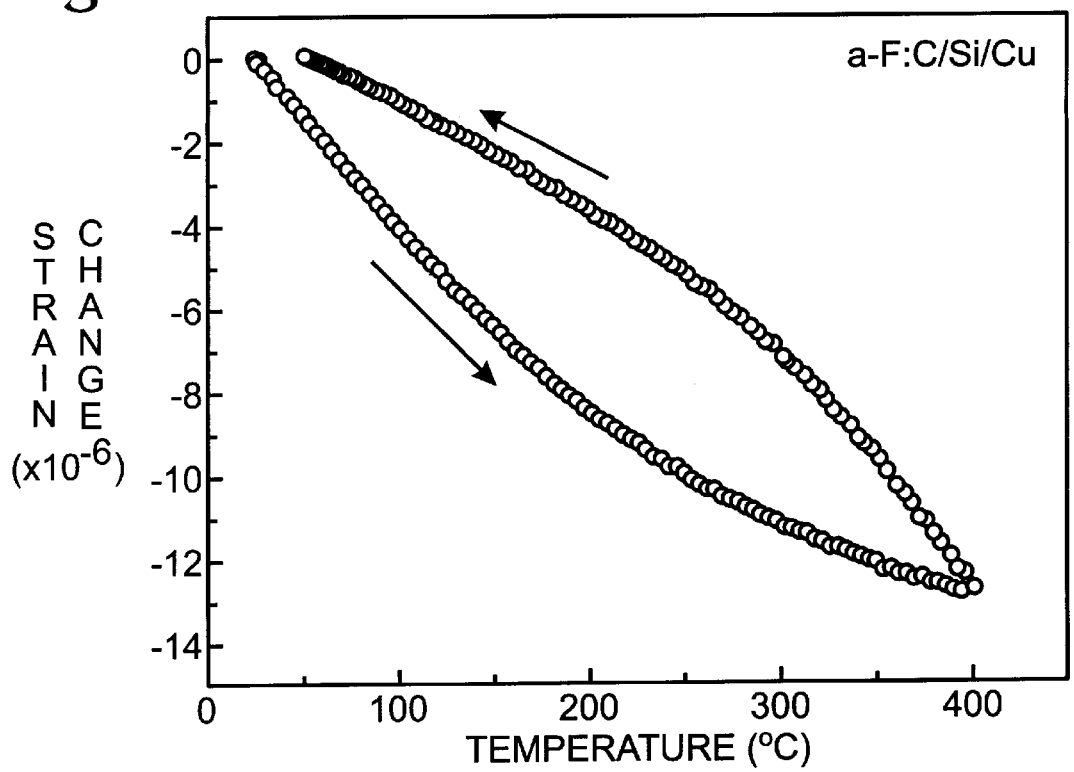
FIG. 7 is a graph illustrating the change in stress of the amorphous fluorinated carbon film of FIG. 5 over a range of temperatures when a backside film is used.

FIG. 7 is a graph illustrating the change in stress of amorphous fluorinated carbon film of FIG. 5 over a range of temperatures when a backside film is used. Returning briefly to FIG. 5, first film 32 is amorphous fluorinated carbon, second film 34 is silicon, and backside film 36 is copper. The increasing negative stress, corresponding to an increase in temperature, is an indication that a compressive stress is applied to first film 32 during annealing.

Figure 8:
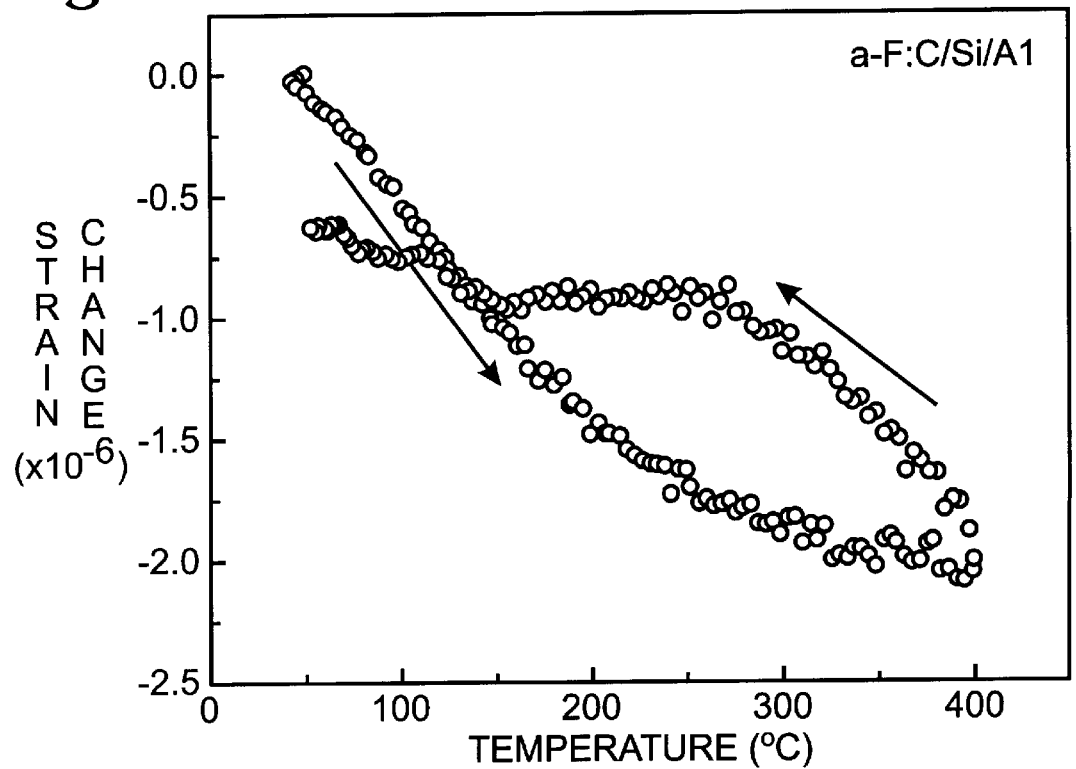
FIG. 8 is also a graph illustrating the change in stress over a range of temperatures when a backside film is used.

FIG. 8 is also a graph illustrating the change in stress over a range of temperatures when a backside film is used. FIG. 8 depicts the results of stress against temperature when first film 32 is amorphous fluorinated carbon, second film 34 is silicon, and backside film 36 is aluminum. Film strain was measured using an FLX 2300 stress management system. Strain change was measured against the strain measured at 20 degrees C. The strong relationship between negative strain and temperature, as shown in FIGS. 7 and 8 is an indication that the amorphous fluorinated carbon films become more compressed as temperature increases. Similar results are observed when backside film 36 is tungsten, tungsten nitride, titanium nitride, and nickel.

Figure 9:
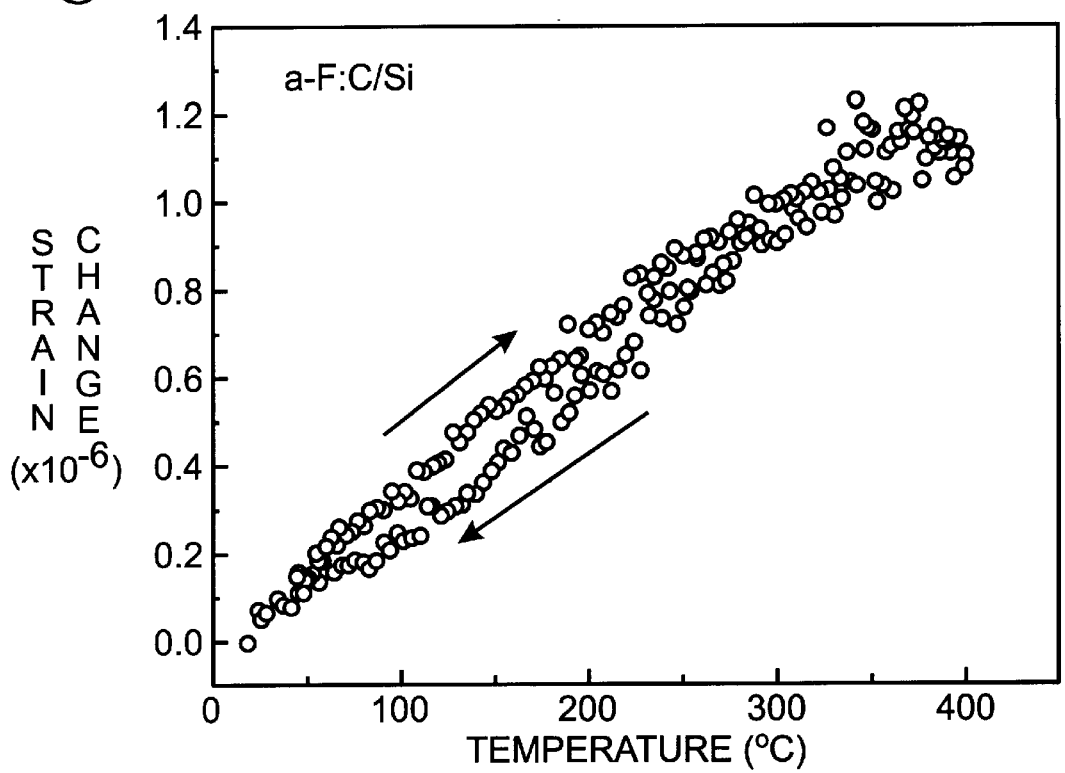
FIG. 9 is a graph which illustrates the change in stress over a range of temperatures when a backside film is not used.

FIG. 9 is a graph which illustrates the change in stress over a range of temperatures when backside film is not used. Referring briefly to FIG. 1 as an example, amorphous fluorinated carbon film 12 is deposited over second film 18. Second film 18 is silicon. No backside film 36 underlies second film 18. The increasingly positive change in stress, corresponding to an increase in temperature, is an indication that first film 12 is subject to a tensile stress during annealing.

Figure 10:
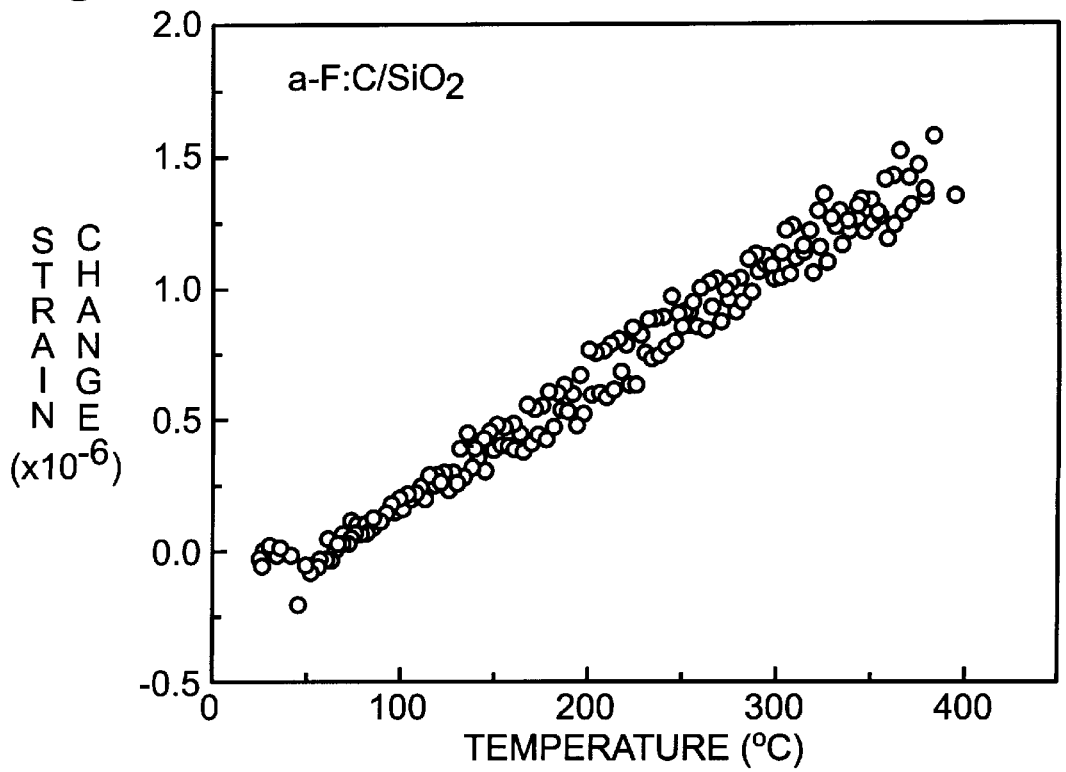
FIG. 10 is a graph which also illustrates the change in stress over a range of temperatures when a non-metallic backside film is used.

FIG. 10 is a graph which also illustrates the change in stress over a range of temperatures when a non-metallic backside film is used. Referring briefly to FIG. 5, amorphous fluorinated carbon film 32 overlies silicon film 34, which overlies a silicon dioxide film 36. When metal does not coat the wafer backside, such as in FIG. 1, or when wafers 30 of FIG. 5 uses a backside coating 36 of silicon oxide or silicon nitride, shape of the wafer becomes convex when heated. As a result, the film strain changes positively with increasing temperatures. That is, the wafer takes a concave shape a high temperatures and the amorphous fluorinated carbon films are exposed to a tensile stress. Upon cooling, film thickness 37 has been reduced.

FIG. 11 is a table illustrating the thermal stability of an amorphous fluorinated carbon film after annealing with a variety of wafer backside films 36. When the wafer has no backside coating 36, or when silicon dioxide and silicon nitride are used as backside film 36 material, then the amorphous fluorinated carbon film is not thermally stable. The thermal instability is represented by a large percentage of change in film thickness 37 (FIG. 5), between 19 and 21 percent. However, when wafer backside film 36 is a material having the thermal coefficients of a metal, the percentage of change is small. A percentage of change less than 5 percent represents relatively stable amorphous fluorinated carbon films. A change of less than 1 percent is considered to be thermally stable.

Figure 12:
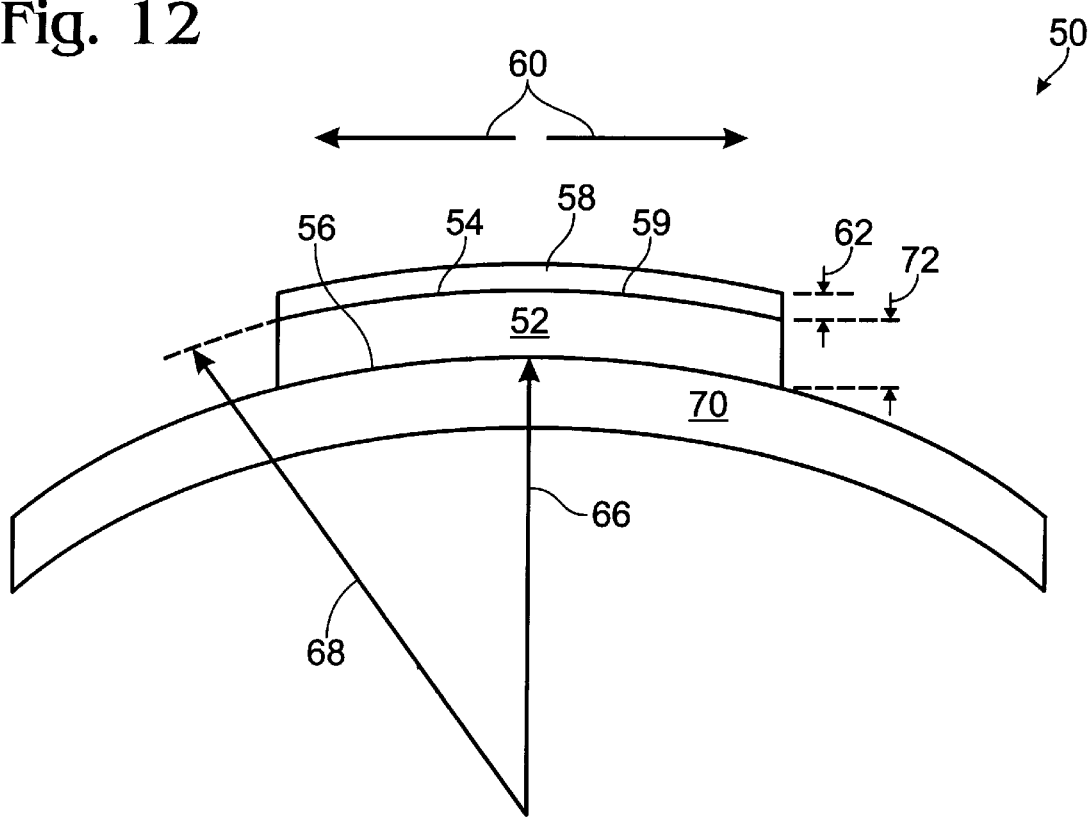
FIGS. 12–14 are stages in forming a completed stress-loaded wafer.
Figure 13:
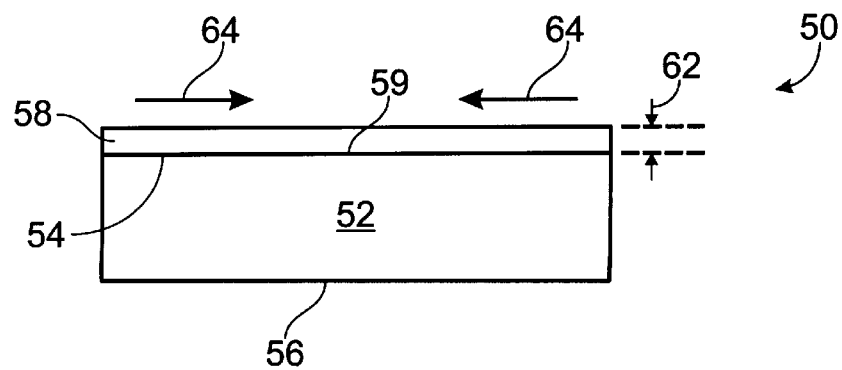
Figure 14:
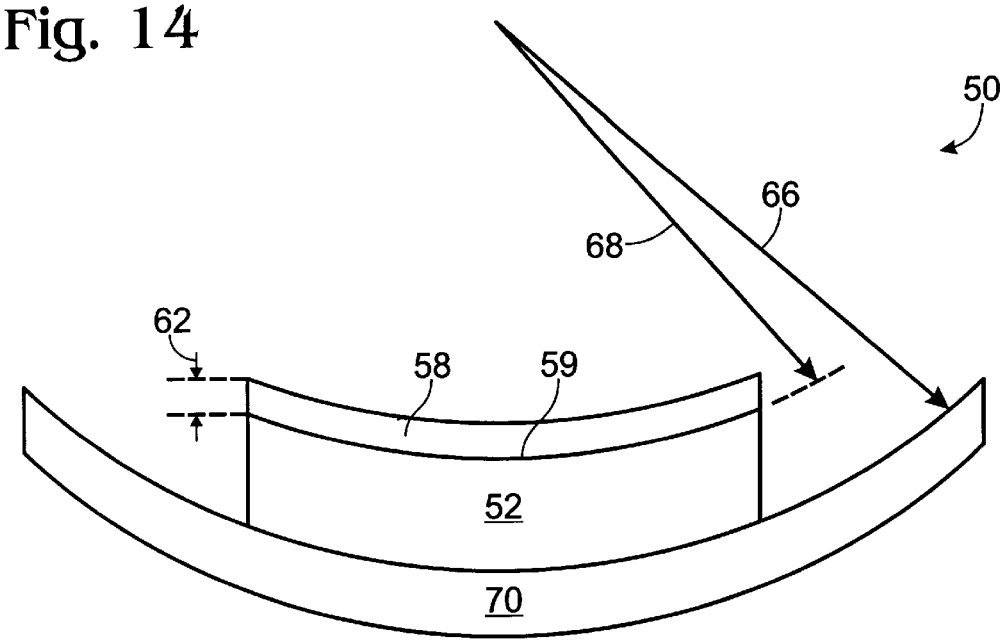

FIGS. 12–14 are stages in forming a completed stress-loaded wafer. FIG. 12 is a side view of wafer 50 comprising a second film 52 having a top surface 54 and a bottom surface 56. A first film 58 overlies second film top surface 54 with a bottom surface 59. First film 58 is selected from the group consisting of amorphous fluorinated carbon, copper, $TaN_x$, $Si-N_x$, $Si-O_x$, $TiN_x$, parylene F, parylene N, SiOF, polysloxane, fluoropolymer, substituted silesquioxanes, and nonsubstituted silesquioxanes. First film 58 develops a second stress as an end result of the present invention process, as depicted in FIG. 13, and described below. The second stress is formed by applying a first, opposite stress 60 to second film 52 and first film 58 during the deposition of first film 58 on second film 52. First stress is represented with arrows having the reference designator 60. First stress 60 is translated through second film 52, to first film 58, during the deposition process. Alternately, first stress 60 is translated through second film 52, to first film 58, while first film 58 is pliable. First film 58 has a first thickness 62.

FIG. 13 is a side view of wafer 50 of FIG. 12 following the release of second film 52 from first stress 60. First stress 64 loads first film 58 when second film 52 is released from second stress 60. In this manner, a stress on second film 52 is used to stress first film 58. In some aspects of the invention, other films (not shown) may intervene between first film 58 and second film 52.

Returning to FIG. 12, first stress 60 is created by forming a predetermined first radius curve along second film bottom surface 56, and a predetermined second radius curve along first film bottom surface 59. The first radius is labeled with reference designator 66, and the second radius is labeled with reference designator 68.

In some aspects of the invention, second film bottom surface 56 is secured to a wafer chuck 70 having a curved mounting surface with a first radius 66 to form the first radius curve on second film bottom surface 56. Wafer 50 is secured to chuck 70 by mechanical, electrostatic, and vacuum means. First stress 60 and is provided by securing second film 52 to wafer chuck 70. In some aspects of the invention, additional film (not shown) intervene between wafer chuck 70 and second film 52.

First radius 66 is in the range between 1 and 1000 m. Second film 52 has a second thickness 72 in the range between 0.1 and 10 $\mu$, and second radius 68 is in the range between 1 and 1000 m. Because second film 52 is so thin, there is typically very little difference between first 66 and second 68 radii, even when additional layers (not shown) intervene between films 52 and 58.

As shown in FIGS. 12 and 13, in some aspects of the invention, first stress 60 is tensile and second stress 64 is compressive. In one specific aspect first film 58 is an amorphous fluorinated carbon film, second stress 64 is a compressive stress, and first stress 60 is a tensile stress.

Typically, first 58 and second 52 films are annealed at a first temperature in subsequent IC processes, following the release of second film 52 from first stress 60. The annealing process is stopped after a first time duration. Thermally stable first film 58 has a small difference in thickness 62 from the originally deposited first thickness 62. Thickness 62 of first film 58 remains constant over temperature. The difference in first thickness 62 is in the range between zero and five percent. The first temperature is in the range between 250 and 450 degrees C. The annealing first time duration is in the range between 15 and 60 minutes. First film 58 is deposited with a plasma chemical vapor deposition (PECVD), metal organic CVD (MOCVD), CVD, evaporation, sputtering processes. The deposition process does affect the inherent stress of the deposited film and, therefore, the degree of stress modification required in the subsequent steps of the method.

FIG. 14 is a side view of wafer 50 where first stress 64 is compressive and second stress 60 is tensile. Typically, first 58 and second 52 films are annealed at the first temperature following the release of second film 52 from first stress 60. Then, the annealing process is stopped after the first-time duration, and thermally stable first film 58 retains its thickness without buckling. That is, buckling does not occur, as shown in FIG. 4 and discussed above. The first temperature is in the range between 250 and 450 degrees C, and the annealing first time duration is in the range between 15 and 60 minutes.

Figure 15:
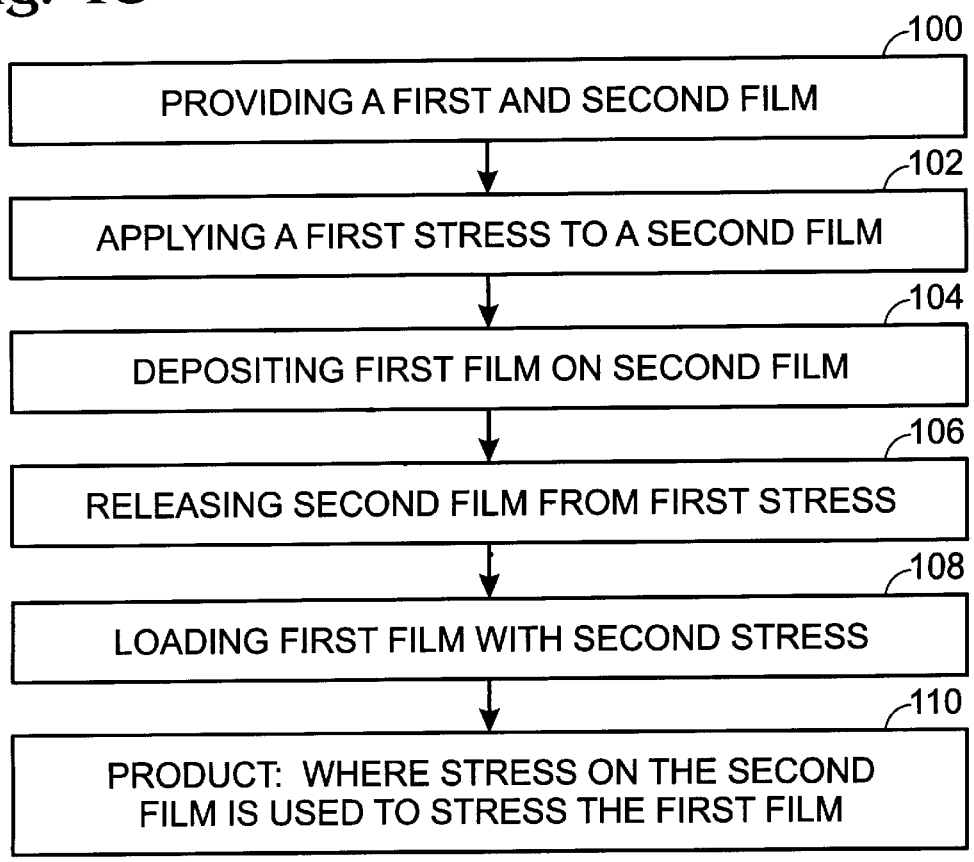
FIG. 15 is a flow chart illustrating steps into method performing a stress-loaded film.

FIG. 15 is a flow chart illustrating steps in a method of forming a stress-loaded film, or forming a stress-free interface between film layers. Step 100 provides a first film and a second film having top and bottom surfaces. Step 102 applies a first predetermined stress to the top surface of the second film. In some aspects of the invention, Step 102 includes forming a predetermined first radius curve, in the range between 1 and 1000 m, along the second film bottom surface. The second film bottom surface is secured to a wafer chuck having a curved mounting surface with a first radius. The chuck surface curves include convex and concave shapes. In this manner, the stress is provided by securing the second film to the wafer chuck. Step 104 deposits the first film overlying the second film top surface. In some aspects of the invention, Step 104 forms a predetermined second radius curve along the first film bottom surface. Step 106 releases the second film from the stress applied in Step 102. Step 108, in response to releasing the second film from the first stress, loads the first film with the second stress, opposite from the first stress. Typically, additional film layers are deposited on the first layer in subsequent processing steps (not shown). Step 110 is a product where stress on the second film is used to stress the first film, or to modify an inherent stress in the first film.

In some aspect of the invention Step 100 provides a second film having a second thickness in the range between 0.1 and 10 $\mu$. Then, Step 102 includes a second radius being in the range between 1 and 1000 m.

In some aspects of the invention step 102 includes the first stress being tensile. Then, Step 108 includes the second stress being compressive. When the amorphous fluorinated carbon is the first film, Step 102 includes applying a tensile stress to the surface of the second film, and Step 108 includes loading a compressive stress on the amorphous fluorinated carbon film. In this manner, a stress on the second film is used to put an opposite stress on the amorphous fluorinated carbon film. Step 102 includes securing the second film bottom surface to a wafer chuck having a convex mounting surface with a first radius, whereby the stress is provided by securing the second film to the wafer chuck.

Further steps follows step 108 (not shown). Step 108a anneals the first and second films at a first temperature. Step 108b stops the annealing process started in Step 108a after a first-time duration. The first film has a small difference in thickness from the first thickness deposited in Step 104. In this manner, the thickness of the first film remains constant over temperature. Step 108b includes the difference in first thickness being in the range between 0 and five percent. Step 108a includes the first temperature being in the range between 250 and 450 degrees C. Step 108b includes a first time duration to be in the range between 15 and 60 minutes.

In some aspects of the invention, Step 102 includes the first stress being compressive. Then, Step 108 includes the second stress being tensile. In this scenario, Step 108a anneals the first and second films at a first temperature in the range between 250 and 450 degrees C, and Step 108b stops the annealing process started in Step 108a. after a first-time duration in the range between 15 and 60 minutes. In this manner, a first film is formed without the occurrence of buckling.

In some aspects of the invention, Step 100 provides a first film selected from the group consisting of amorphous fluorinated carbon, copper, $TaN_x$, $Si-N_x$, $Si-O_x$, $TiN_x$, parylene F, parylene N, SiOF, polysloxane, fluoropolymer, substituted silesquioxanes, and nonsubstituted silesquioxanes. Step 104 includes the first film being deposited with PECVD, MOCVD, CVD, evaporation, and sputtering process.

A method and product by process has been provided to counteract the inherent tensions in a deposited film. The substrate is fixed to a wafer chuck having a curved surface. When the chuck surface is convex, a tensile stress is implanted in a deposited film. Upon release from the chuck, the deposited film develops a compressive stress. When the chuck surface is concave, a compressive stress is implanted in the deposited film. Upon release from the chuck, the deposited film develops a tensile stress. Loading a film with a compressive stress is helpful in making films having an inherently tensile stress thermally stable. Loading the film with tensile stress is helpful for films subject to buckling at high temperatures. Either type of tension loading may be used to prevent stress mismatches between film layers, and to improve adhesion. Other variations and embodiments of the above-discussed invention will occur to those skilled in the art.

What is claimed is:

1. A method for depositing an amorphous fluorinated carbon (a-F:C) film on an integrated circuit (IC) wafer substrate, the method comprising the steps of:

providing a silicon wafer having top and bottom surfaces;

applying a tensile stress to the top surface of the wafer by forming a first radius curve in the wafer such that the bottom of the wafer is concave depositing the layer of a-F:C film on the top surface of the wafer;

releasing the tensile stress applied to the top surface of the wafer; and in response to releasing the tensile stress in the preceding step, applying a compressive stress to the a-F:C film, whereby the compressive stress on the a-F:C film increases the thermal stability of the a-F:C film.

2. The method as in claim 1 in which said step of applying a tensile stress to the ton surface of the wafer includes securing the bottom surface of the wafer to a wafer chuck having a convex mounting surface with a first radius, whereby the stress is provided by securing the wafer to the wafer chuck.

3. The method as in claim 2 in which said step of applying a tensile stress to the top surface of the wafer includes using a wafer chuck having a convex mounting surface with a first radius in the range between 1 and 1000 m.

4. A method as in claim 1 including further steps, following the steps of releasing the tensile stress applied to the top surface of the wafer and responsively applying a compressive stress to the a-F:C film, of:

annealing the a-F:C film at a first temperature; and stopping the annealing process after a first time duration, whereby the thickness of the a-F:C film remains constant over temperature.

5. The method as in claim 4 including stopping the annealing process such that the difference in thickness of the a-F:C film is in the range between 0 and 5%.

6. The method as in claim 4 in which said annealing step includes a first temperature in the range between 250 and 450 degrees C.

7. The method as in claim 4 in which said step of stopping the annealing process includes a first time duration in the range between 15 and 60 minutes.

8. The method as in claim 1 in which said step of depositing a layer of a-F:C film includes depositing the a-F:C film using a deposition process selected from the following:

PECVD, MOCVD, CVD, evaporation, and sputtering.

9. A method as in claim 1 in which said step of applying a tensile stress to the top surface of the wafer includes applying a material having the thermal coefficient of a metal to the bottom surface of the wafer, and heating the wafer to apply said tensile stress to the top surface by causing the bottom of the wafer to become concave.

10. A method as in claim 9 in which said step of releasing the tensile stress from the top surface of the wafer includes cooling the wafer.

11. A method as in claim 1 in which said step of applying a tensile stress to the top surface of the wafer includes applying to the bottom surface of the wafer a layer of material selected from the following: copper, aluminum, tungsten, tungsten nitride, titanium nitride, and nickel; and heating the wafer to apply said tensile stress to the top surface by causing the bottom of the wafer to become concave.

* * * * *